United States Patent [19]

Yamada et al.

[11] Patent Number: 4,521,744
[45] Date of Patent: Jun. 4, 1985

[54] TUNING APPARATUS OF PHASE-LOCKED LOOP TYPE

[75] Inventors: Takaaki Yamada, Zama; Yukio Tsuda, Atsugi; Akira Yamakoshi, Saitama, all of Japan

[73] Assignee: Sony Corporation, Tokyo

[21] Appl. No.: 450,793

[22] Filed: Dec. 17, 1982

[30] Foreign Application Priority Data

Dec. 22, 1981 [JP] Japan .................................. 56-207303

[51] Int. Cl.³ ............................................... H03L 7/08
[52] U.S. Cl. ..................................... 331/1 A; 331/16; 331/25; 455/260
[58] Field of Search ........................... 331/1 A, 16, 25; 455/260

[56] References Cited

U.S. PATENT DOCUMENTS

4,321,555  3/1982  Howk et al. ........................ 331/1 A
4,392,253  7/1983  Yamada et al. ................. 331/1 A X Primary Examiner—Eugene R. LaRoche
Assistant Examiner—Robert J. Pascal
Attorney, Agent, or Firm—Lewis H. Eslinger; Alvin Sinderbrand

[57] ABSTRACT

A tuning apparatus of phase-locked loop type having a voltage controlled oscillator which is working as a local oscillator of a tuning circuit, a programmable divider supplied with the output signal from the voltage controlled oscillator, a reference frequency signal generating circuit, a phase comparator supplied with the output signal from the voltage controlled oscillator and the output signal from the reference frequency signal generating circuit, and supplying the output signal to the voltage controlled oscillator, the programmable divider, the reference frequency signal generating circuit and the phase comparator being formed in a single integrated circuit, and a control circuit formed separately from the integrated circuit for supplying a control data to the programmable divider in the single integrated circuit is disclosed, in which the integrated circuit further comprises a memory for memorizing the control data which is serially supplied from the control circuit and supplying the control data to the programmable divider in parallel.

4 Claims, 10 Drawing Figures

FIG. 5A Latch Command Signal

FIG. 5B Data Signal

FIG. 5C Clock Pulse

TUNING APPARATUS OF PHASE-LOCKED LOOP TYPE

BACKGROUND OF THE INVENTION

1. Field of the Invention

The present invention relates generally to a tuning apparatus of phase-locked loop type, and is directed more particularly to a tuning apparatus of phase-locked loop type by which the number of signal lines connected between a control circuit and a phase locked loop circuit can be reduced, the number of output terminals of the control circuit can be also reduced and the control program of the control circuit can be simplified so that the memory capacity of a memory housed in the control circuit can be reduced.

2. Description of the Prior Art

As one of the prior art tuning systems employed in a television receiver and a radio receiver, there is a tuning system of PLL (phase-locked loop) type. By this tuning system of PLL type, the oscillating frequency of a local oscillator in a tuning circuit can be quite accurately varied in response to the carrier frequency of a broadcasting wave and the oscillating frequency is very stable so that such a tuning system of PLL type has been employed frequently at present.

Figure 1:
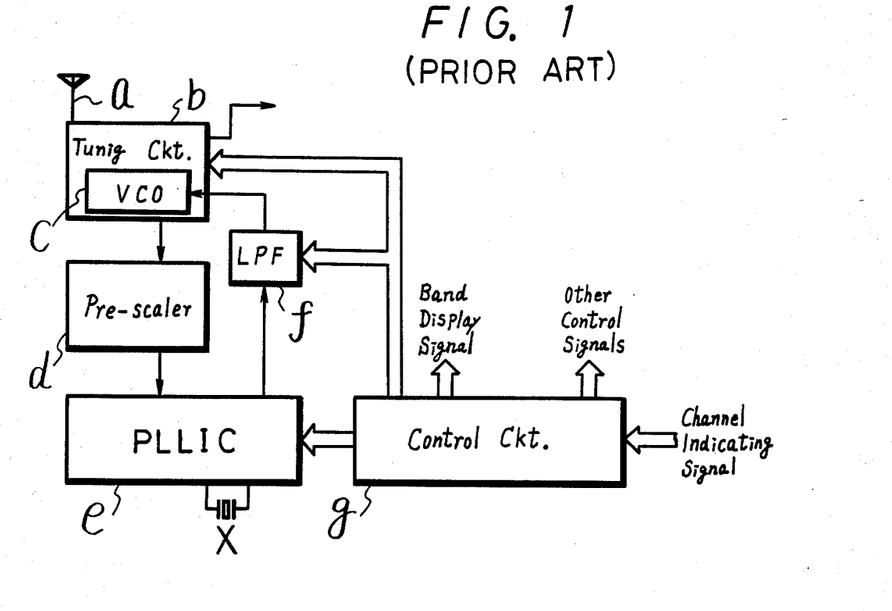
FIG. 1 is a block circuit diagram showing an example of the prior art tuning apparatus for use with a television receiver.

FIG. 1 shows a prior art tuning apparatus of PLL type for use with a television receiver. In FIG. 1, a reference letter a designates an antenna, b a tuning circuit, c a VCO (voltage controlled oscillator) working as a local oscillator in the tuning circuit b, d a pre-scaler for frequency-dividing the output signal from the VCO d, e an integrated circuit which is called as a PLLIC (phase locked loop integrated circuit) and hence referred to simply as PLLIC hereinafter and which comprises therein a programmable divider to frequency-divide the output signal from the pre-scaler d, a reference frequency signal generator utilizing a quartz, a phase comparator to compare the phase of the output signal from the reference frequency signal generator with that of the output signal from the programmable divider and so on. Reference letter f denotes a low pass filter through which the output of the phase comparator in the PLLIC e or oscillating frequency controlling voltage is applied to the control terminal of the VCO c, and g a control circuit which controls the tuning circuit and is formed of a so-called one-chip micro-computer. When this control circuit g is supplied with the signals pointing or commanding a channel through an adequate input apparatus such as a so-called ten-key and so on, this control circuit g outputs or delivers various signals to respective parts in response to the supplied signal thereto. Practically, the control circuit g supplies such a signal to the PLLIC e that the dividing ratio of the programmable divider is controlled, such a signal to the tuning circuit b, that is, band switching signal such as in Japan to switch among VHF low band (channel 1 to channel 3), VHF high band (channel 4 to channel 12) and UHF band (channel 13 to channel 62) and a signal to the low pass filter f to appoint its time constant, respectively. In the case of displaying a band, the control circuit g delivers a band display signal. In other cases where other control signals are required, this control circuit g delivers such required control signals.

With this prior art tuning apparatus, when the input apparatus such as the ten-key (not shown) is operated to appoint a certain channel such as the channel 3 of the VHF, the control circuit g supplies the control signal to the PLLIC e and hence the dividing ratio of its programmable divider is switched into such a value to receive the channel 3 and the time constant of the low pass filter f is suitably switched by the switching signal from the control circuit g. Also, the tuning circuit b is switched in band to the VHF by the band switching signal from the control circuit g.

In accompany with the fact that the dividing ratio of the programmable divider is changed over, the VCO c generates the local oscillating signal with the frequency corresponding to, for example, the channel 3. This local oscillating signal is mixed with the high frequency signal applied to the tuning circuit b so that an intermediate frequency signal is obtained from which, for example, the broadcasting wave of the channel 3 can be received or reproduced. At the same time, the display of the band, for example, "low" of VHF is displayed.

Figure 2:
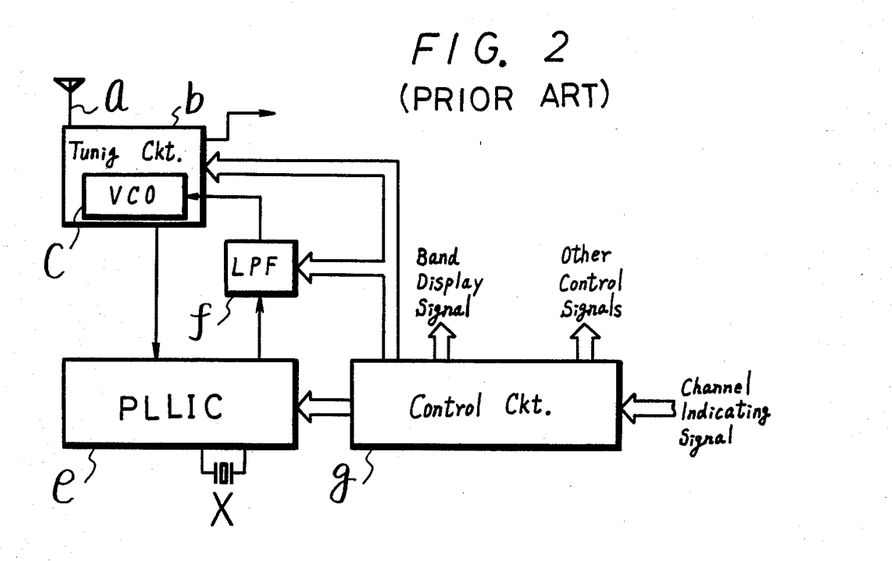
FIG. 2 is a block circuit diagram showing an example of the prior art tuning apparatus for use with a radio receiver.

FIG. 2 shows an example of the tuning apparatus of the PLL type used in a prior art radio receiver. This tuning apparatus differs from that shown in FIG. 1 in only such a fact that the former has no pre-scaler and hence there is no fundamental difference between the tuning apparatus of FIGS. 1 and 2. Thus, its explanation will be omitted.

In such PLL type tuning apparatus, there are various problems as follows:

At first, the number of the signal lines connecting the tuning circuit b, PLLIC e and so on to the control circuit g is many and the number of necessary output terminals of the control circuit g made of one-chip is also many. Such point will be now explained practically with the tuning apparatus of a television receiver as an example. In general, due to the system construction of the television receiver, the tuning circuit b, PLLIC e, pre-scaler d and low pass filter f are located in the deep or back portion of the television receiver, while since the control circuit g must be located near the input apparatus such as a channel select switch or the like, the control circuit g is disposed at a position near a control panel i.e. near the front side of the television receiver. Accordingly, the distance between the control circuit g and the tuning circuit b, PLLIC e and so on becomes relatively long, and also many signal lines must be connected therebetween. It is, however, undesired that a number of long signal lines are wired within the television receiver in view of its circuit construction, electrical characteristics, the number of assemble working processes and so on. Further, although the treating ability and the number of terminals of the control circuit g made of one-chip micro-computer are limited, the kinds of objects to be controlled thereby are relatively many. To cope therewith, there are employed such means in which one terminal is used for delivery and input of a plurality of kinds of signals by delaying the time therebetween. As a result, the control program becomes naturally quite complicated.

Figure 3:
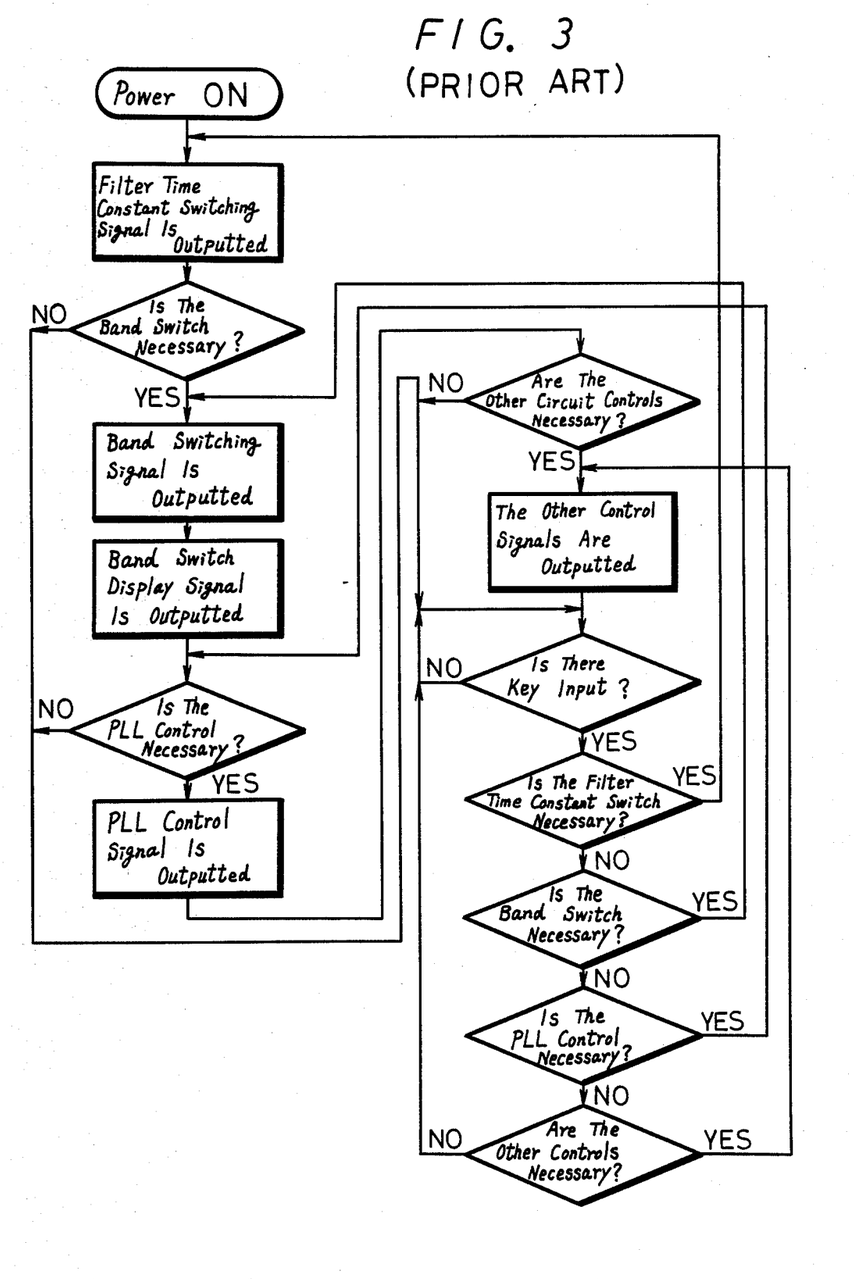
FIG. 3 is a flow chart showing an example of the control program of the prior art tuning apparatus shown in FIG. 1 or FIG. 2.

FIG. 3 is a flow chart showing the control program of the prior art tuning apparatus. From this flow chart it will be apparent that this flow chart can never be said as simple. Thus, the area of a memory necessary to memorize the program becomes wide and the time period from the start of the control to its termination becomes long. If, in order to reduce the time period, a micro-computer capable of carrying out high speed process is used to form the control circuit g, its cost is increased very much.

OBJECTS AND SUMMARY OF THE INVENTION

Accordingly, it is an object of the present invention to provide a tuning apparatus of PLL (phase-locked loop) type free from the problems encountered in the prior art.

It is another object of the invention to provide a tuning apparatus of PLL type in which the number of signal lines connecting a control circuit to a tuning circuit of PLL type can be reduced.

It is a further object of the invention to provide a tuning apparatus in which the control program by the control circuit can be simplified and accordingly the memory content of a memory in the control circuit can be reduced.

According to an aspect of the present invention, there is provided a tuning apparatus of phase-locked loop type which comprises:

(a) a voltage controlled oscillator which is working as a local oscillator of a tuning circuit;

(b) a programmable divider supplied with an output signal of said voltage controlled oscillator;

(c) a reference frequency signal generating circuit;

(d) a phase comparator supplied with the output signal of said voltage controlled oscillator and an output signal of said reference frequency signal generating circuit and supplying an output signal to said voltage controlled oscillator, said programmable divider, said reference frequency signal generating circuit and said phase comparator being formed in a single integrated circuit; and (e) a control circuit formed separately from said integrated circuit for supplying a control data to said programmable divider in said single integrated circuit, characterizing in that said integrated circuit further comprises a memory means for memorizing said control data which is serially supplied from said control circuit and supplying said control data to said programmable divider parallelly.

The other objects, features and advantages of the present invention will become apparent from the following description taken in conjunction with the accompanying drawings through which the like references designate the same elements and parts.

BRIEF DESCRIPTION OF THE DRAWINGS

FIGS. 5A to 5C are respectively time charts showing changes of respective signals upon taking data in;

DESCRIPTION OF THE PREFERRED EMBODIMENT

The present invention will be hereinafter described with reference to the attached drawings.

Figure 4:
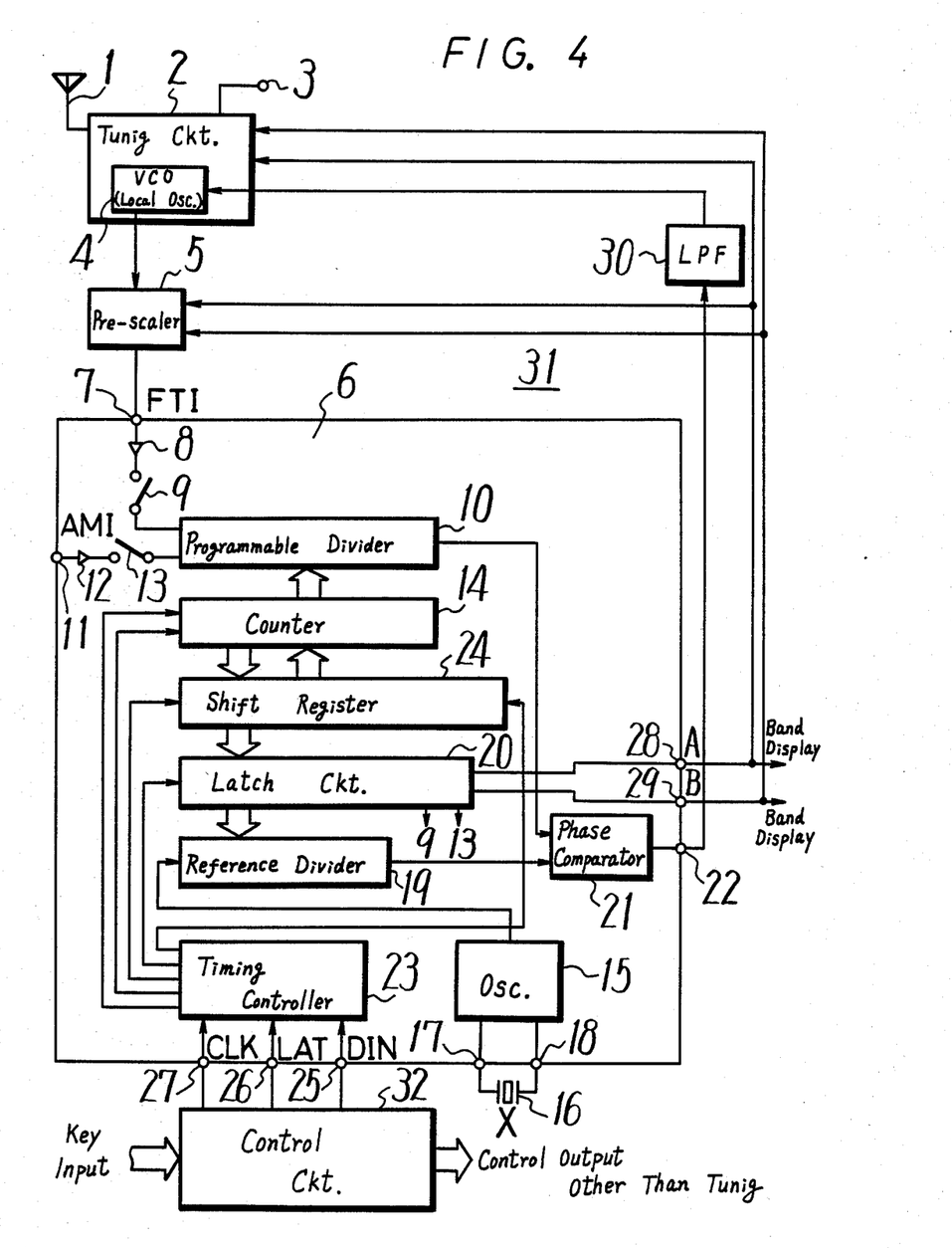
FIG. 4 is a block circuit diagram showing an example of the tuning apparatus according to the present invention.

FIG. 4 is a circuit diagram in which an example of the tuning apparatus according to the invention is applied to a television receiver. In this figure, reference numeral 1 designates an antenna for receiving a television broadcasting wave, and 2 a tuning circuit which amplifies only a high or radio frequency (RF) signal from a desired broadcasting station in those received by the antenna 1 and also produces an intermediate frequency (IF) signal by frequency conversion. Then, this IF signal is delivered through a terminal 3 to an IF amplifier (not shown) provided at the rear stage. Reference numeral 4 designates a voltage controlled oscillator (VCO) working as a local oscillator in the tuning circuit 2. This VCO 4 generates a signal with the frequency corresponding to the control voltage and this signal is mixed with the RF signal amplified in the tuning circuit 2 to thereby provide the IF signal.

In FIG. 4, reference numeral 5 denotes a pre-scaler which frequency-divides the output signal from the VCO 4 and whose dividing ratio can be changed at some steps by the band switching signal from a PLLIC (phase locked loop integrated circuit) described later. Accordingly, the dividing ratio can be made such a value corresponding to the band belonging to a broadcasting wave of a television broadcasting to which selects the dividing ratio. The pre-scaler 5 becomes necessary only in such a case where the PLLIC can not be directly supplied with the output from the VCO 4 due to its frequency, the characteristic of the PLLIC described later and so on i.e. the output from the VCO 4 is supplied, after being divided, to the PLLIC, so that when an FM broadcasting wave is received, the pre-scaler 5 is unnecessary.

In FIG. 4, reference numeral 6 represents an PLLIC which is formed integrally of a programmable divider, a phase comparator, a reference frequency signal generator and so on which form a tuning circuit of PLL type and which is so constructed that it can be used to select any one of an AM medium wave broadcasting, AM short wave broadcasting, FM broadcasting, television VHF broadcasting and television UHF broadcasting. Reference numeral 7 denotes a terminal (FTI) which is used as an input terminal when the FM broadcasting and television broadcasting (VHF and UHF) are received. To the input terminal 7 is supplied the output signal from the pre-scaler 5. The signal supplied to the input terminal 7 is applied through an amplifier 8 and a switching circuit 9 to a programmable divider 10 of the PLLIC 6. A terminal 11 is provided which is used as an input terminal (AMI) when the AM broadcasting (medium and short waves) is received. The signal fed to the terminal 11 is supplied through an amplifier 12 and a switching circuit 13 to the programmable divider 10.

The programmable divider 10 functions to divide the signal from the VCO 4 which is already divided by the pre-scaler 5, and the dividing ratio of the programmable divider 10 is controlled by the signal of multi-bits stored in a counter 14 of the PLLIC 6. A quartz oscillator 15 is provided for generating a reference frequency signal, and a quartz oscillating element 16 is connected through terminals 17 and 18 to the quartz oscillator 15. The signal generated by the quartz oscillator 15 is divided by a reference divider 19 to be a reference frequency signal. The dividing ratio of the reference divider 19 is controlled by a multi-bit signal stored in a latch circuit 20. Thus, the frequency of the reference frequency signal is varied by the dividing ratio of the reference divider 19.

The reason why the reference frequency of the reference frequency signal can be varied is as follows. The broadcasting waves of broadcasting stations have their carrier frequencies held at set values accurately, but there occurs such a case sometimes that the frequency of the RF signal from a video tape recorder is deviated little from its set value and also appears such a case that the carrier frequency is varied somewhat. In order to establish the accurate tuning at the above cases, it is necessary that the carrier frequency is always detected and the reference frequency is somewhat varied in response to the detected result. To this end, the reference frequency is varied by controlling the dividing ratio of the reference divider 19 as set forth above.

In the example of the invention shown in FIG. 4, there is provided a phase comparator 21 which compares the phase of the output signal from the programmable divider 10 with that from the reference divider 19 and the output voltage from which is delivered through a terminal 22 to a low pass filter described later. There are also provided a timing controller 23 which controls the operating timings of the respective circuits in the PLLIC 6; a shift register 24 which is used to receive one bit by one bit data from a control circuit (described later) through the timing controller 23; a data input terminal (DIN) 25 to which the data from the control circuit are applied; a latch command signal input terminal (LAT) 26 to which the latch command signal from the control circuit is applied; a clock pulse input terminal (CLK) 27 to which the control clock pulse from the control circuit is applied; and output terminals 28 and 29 through which the switching signals such as the band switching signal and so on are delivered. For conveniences sake, power supply terminals, ground terminals and so on are omitted in FIG. 4.

In FIG. 4, reference numeral 30 designates the aforesaid low pass filter through which the output voltage from the phase comparator 21 is applied to the VCO 4 in the tuning circuit 2. The time constant of the low pass filter 30 is changed over at some steps by the switching signal for the band and so on.

The VCO 4, pre-scaler 5, PLLIC 6 and low pass filter 30 described above construct a tuning circuit 31.

In FIG. 4, reference numeral 32 denotes the control circuit mentioned above which controls the tuning circuit 31 and which is formed of a so-called one-chip micro-computer. When the control circuit 32 is supplied with the key-input for channel selecting from an input apparatus such as ten-key, which is not shown, it produces various control data in response therewith and supplies the same through the data input terminal 25 to the PLLIC 6. Further, the control circuit 32 supplies the latch command signal and control clock pulse to the PLLIC 6 to control the operation of the same. In addition, the control circuit 32 controls, in addition to the control circuit 31, such as a display member or portion for channel display, a remote control circuit and so on.

As described above, the tuning apparatus of the invention shown in FIG. 4 consists of the tuning circuit 31 and the control circuit 32 controlling the former.

Figure 5A:
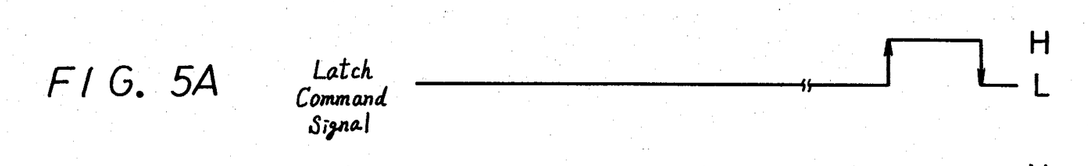
Figure 5B:
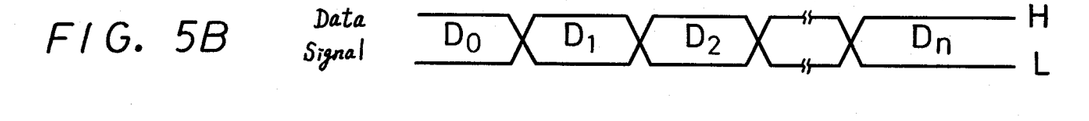
Figure 5C:
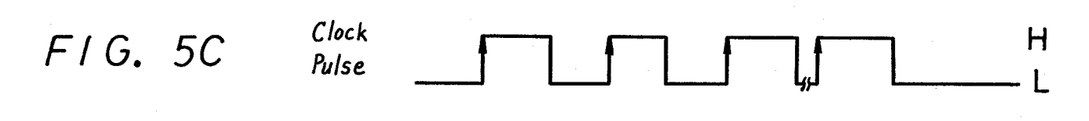
Figure 7A:
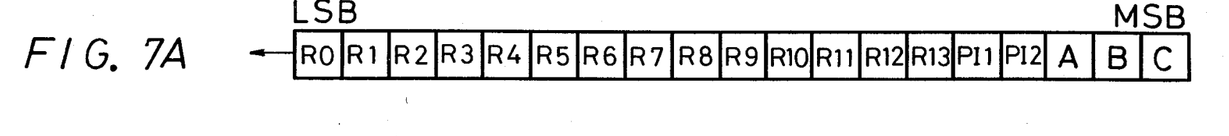
FIGS. 7A and 7B are each showing a data signal delivered from the control circuit.

Now, the description will be given on the operation of the tuning apparatus of the invention set for above. When a power switch of the television receiver is made ON, the various data signals are generated by the control circuit 32 in accordance therewith. In the data provided by the control circuit 32, there are the data appointing the dividing ratio of the reference divider 19; the input terminal selecting data to select which one is selected between the input terminals 7 and 11 to receive the signal through it; band switching data; data appointing the dividing ratio of the programmable divider 10; and so on. As shown in FIG. 5A, the latch command signal is made "low" (which will be hereinafter referred to as "L") at first, so that the PLLIC 6 becomes a data acquisition mode. Under this data acquisition mode, as shown in FIGS. 5B and 5C, data D0, D1, ... are taken one bit by one bit into the shift register 24 of the PLLIC 6 from the control circuit 32 at the rising edge of each clock pulse. The data, which are taken at this time, are such ones as shown in FIG. 7A the data R0 to R13 which appoint the dividing ratio of the reference divider 19, the input terminal selecting data PI1 and PI2, the band switching data A and B, and the latch direction data C, respectively. After the delivery of the above data have been completed, the control circuit 32 makes the latch command signal "high" (which will be hereinafter referred to as "H") as shown in FIG. 5A. Then, the data supplied to the shift register 24 are held in the latched state. Then, based upon the state of the signal at the last bit (MSB) signal of the data latched to the shift register 24, the data are shifted in parallel to the latch circuit 20. The last bit signal C of the data inputted to the shift register 24 is used as a command signal which determines whether the data in the shift register 24 are delivered to the counter 14 or the latch circuit 20. For example, when the last bit signal C is "L", the data are delivered to the latch circuit 20 which then latches the inputted data. As a result, at first the dividing ratio of the reference divider 19 is pointed by the data stored in the latch circuit 20. Further, when the input terminal selecting data PI1 and PI2 are both "H", the switching circuit 9 is made ON (upon receiving the AM radio broadcasting, the input terminal selecting data PI2 becomes "L" and hence the switching circuit 13 becomes ON). Furthermore, the band switching signals or data A and B (2 bits) are delivered from the terminals 28 and 29 which are then supplied to the tuning circuit 2, low pass filter 30 and a band display portion (not shown in FIG. 4). By the band switching data, the tuning circuit 2 is switched to one of the VHF low band, VHF high band and UHF band, the time constant of the low pass filter 30 and also the dividing ratio of the pre-scaler 5 are changed, and further the selected band is displayed on the band displayer portion though not shown.

Figure 7B:
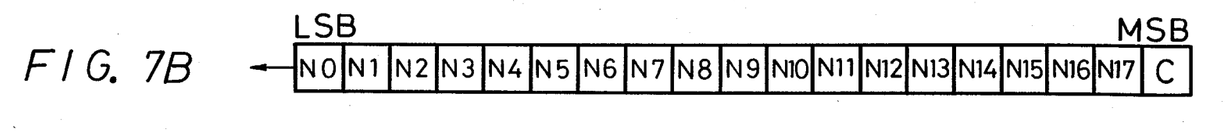

Next, the control circuit 32 changes the latch command signal from "H" to "L" as shown in FIG. 5A. Then, signals or data N0 to N11 shown in FIG. 7B, which appoint the dividing ratio of the programmable divider 10, are delivered one bit to one bit at every rising-up of the clock pulse from the control circuit 32 to the shift register 24 as shown in FIGS. 5B and 5C. After the data have been inputted to the shift register 24, the latch command signal is changed from "L" to "H" as shown in FIG. 5A and the data are held in the latched state in the shift register 24. By the command of the last bit (LSB) signal (in this case, the signal C is "H") of the data, the data are parallelly shifted to the counter 14 and then latched therein. Further, the dividing ratio of the programmable divider 10 is switched to the value appointed by the data. As described above, the data are inputted to the PLLIC 6 by two steps in the illustrated example of the invention.

When the above operation is finished, the phase comparator 21 compares the phase of the output signal from the programmable divider 10 with that of the reference frequency signal from the reference divider 19 and then delivers the control voltage with the level corresponding to the phase difference. This control voltage is applied through the low pass filter 30 to the VCO 4 so that this VCO 4 produces the local oscillating signal with the frequency corresponding to the carrier frequency of the broadcasting wave of the selected broadcasting station. Then, the local oscillating signal is mixed with the RF signal to produce the IF signal which is then delivered through the terminal 3 to the IF amplifier, which is not shown, so that the selected broadcasting wave can be received or reproduced.

When the channel is changed over and where the band change is accomplished, the above described operation is repeated. However, when the channel change is within the same band, only the data which appoint the dividing ratio of the programmable divider 10 are changed, but such operation is not carried out to change the data which appoint the dividing ratio of the reference divider 19, the switching data for the band and so on and the input selecting data. It may be possible in the case of the channel change with no band change that the counter 14 is made as the up-mode by making, for example, the latch command signal "H" and the data, which are already stored in the counter 14 to appoint the dividing ratio, are increased or decreased one by one by the signal supplied through the input terminal 25 to thereby change the receiving frequency rapidly.

In the illustrated example of the invention, the transmission of the data from the control circuit 32 to the PLLIC 6 is performed one-bit by one-bit, but if the number of the data input signal lines is increased suitably, it is possible that data of plural bits are transmitted at the same time to shorten the time period required in channel selecting process.

Figure 6:
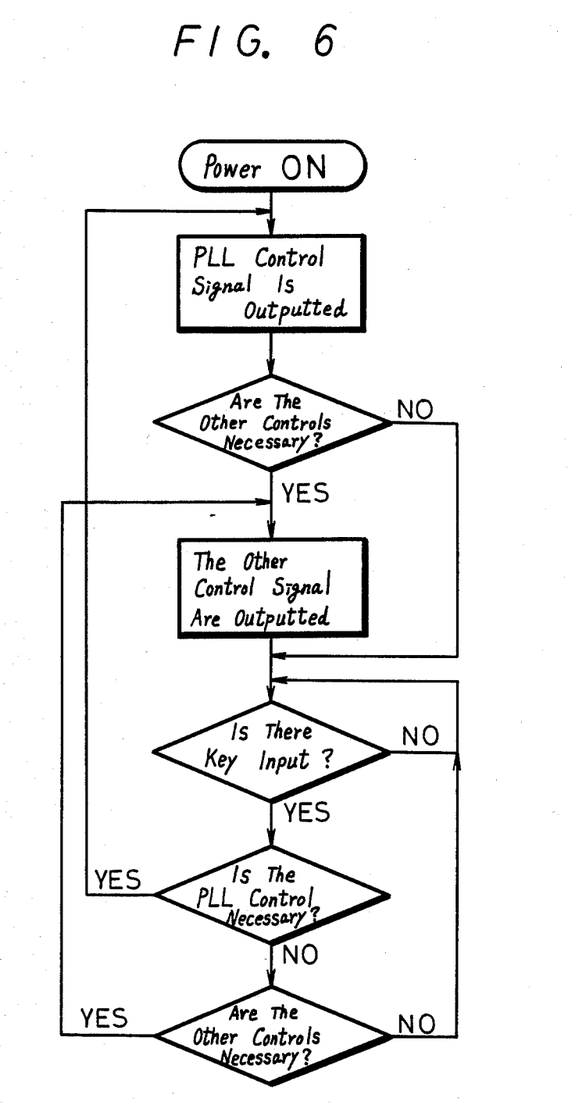
FIG. 6 is a flow chart showing an example of control programs by the control circuit.

The control circuit 32 controls the circuit other than the tuning circuit 31. FIG. 6 is a flow chart showing an example of the control program including the control of the tuning circuit 31 and the control of the circuit other than the tuning circuit 31.

As described above, the tuning apparatus of the present invention includes the tuning circuit of PLL type in which the output signal from the VCO working as the local oscillator of the tuning circuit is divided by the pre-scaler and the programmable divider or only the programmable divider, the phase of the divided signal is compared with that of the reference frequency signal delivered from the reference frequency signal generating circuit by the phase comparator and the output voltage from the phase comparator is applied through the low pass filter or directly to the VCO to thereby control its oscillating frequency, and the control circuit which controls the above tuning circuit of PLL type. In this case, some circuits forming the tuning circuit, for example, programmable divider, the reference frequency signal generating circuit, phase comparator and so on are made in a single integrated circuit. The respective control signals from the control circuit to control the tuning circuit are all supplied to the single integrated circuit, temporarily memorized in the integrated circuit and then delivered to the respective circuits within the integrated circuit and to the circuit outside of the integrated circuit. Therefore, the number of the signal lines connecting the control circuit to the tuning circuit can be reduced and hence the number of the terminals at the control circuit necessary for the tuning can be reduced. That is to say, according to the tuning apparatus of the present invention, the respective control signals supplied from the control circuit to the tuning circuit are all supplied to the single integrated circuit (PLLIC 6 in the illustrated example) in which the programmable divider, phase comparator, reference frequency signal generating ciccuit and so on, constructing the parts of the tuning circuit, are formed, temporally memorized in the integrated circuit and then delivered to the respective circuits within the integrated circuit and to the circuit outside of the integrated circuit. Accordingly, the control signals can be transmitted from the control circuit to the tuning circuit through small number of the signal lines connecting the control circuit with the integrated circuit and also the number of the terminals at the control circuit necessary for the tuning can be reduced. As a result, it becomes unnecessary that one terminal of the control circuit is used in a superimposed manner and hence it becomes of course unnecessary that a latch circuit is provided outside due to the superimposed use of the terminal. Further, in accompany therewith, the control program by the control circuit becomes quite simple as shown in FIG. 6. Owing to the fact that the control program becomes simple, the area of the memory necessary to memorize the program of the control circuit becomes narrower and hence the small memory capacity is enough. In addition, the time period necessary from the start of the control to its termination becomes naturally short so that even if an integrated circuit capable of processing at high speed is not used as the integrated circuit forming the parts of the control circuit and the tuning circuit, the tuning process can be carried out at relatively high speed. Therefore, without employing an expensive integrated circuit and so on, the tuning apparatus can be made.

The above description is given on a single preferred embodiment of the invention, but it will be apparent that many modifications and variations could be effected by one skilled in the art without departing from the spirits or scope of the novel concepts of the invention, so that the scope of the invention should be determined by the appended claims only.

We claim as our invention:

1. A tuning apparatus of the type including a phase-locked loop comprising:
 a voltage controlled oscillator which is working as a local oscillator and producing a first output signal;
 a phase-locked loop integrated circuit including programmable divider means responsive to said first output signal of said voltage controlled oscillator to produce a second output signal, reference frequency signal generating circuit means producing a third output signal, phase comparator means supplied with said second and third output signals for providing a controlling output to said voltage controlled oscillator in response to said second and third output signals, and memory means; and
 control circuit means formed separately from said phase-locked loop integrated circuit for supplying control data to said memory means serially;
 said memory means being responsive to control data stored therein to supply said control data in parallel to a selected one of said programmable divider means and said reference frequency signal generating means for fine control of said second and third output signals, respectively.

2. A tuning apparatus according to claim 1, further including:
    low pass filter means having a variable time constant dependent on said control data from said memory means and through which said controlling output signal is passed from said phase comparator means to said voltage controlled oscillator.

3. A tuning apparatus according to claim 2, further including:
    pre-scaler means having a variable dividing ratio dependent on said control data for dividing said first output signal and transmitting said divided signal to said programmable divider means.

4. A tuning apparatus according to claim 1; wherein said reference frequency generating circuit means includes reference frequency divider means;
    said memory means includes a shift register for receiving said serial control data from said control circuit means and storing the same therein, counter means connected between said programmable divider means and said shift register, and latch means connected between said shift register and said reference frequency divider means;
    said memory means is responsive to a first value of a portion of said control data to transmit said control data in parallel to said counter means, an output of said counter means is supplied to said programmable divider means to determine a first dividing ratio thereof, said memory means is further responsive to a second value of said portion of said control data to supply said control data in parallel to said latch means, with a part of the control data supplied to said latch means being further supplied to said reference frequency divider means for determining a second dividing ratio thereof;
    and said memory means further includes timing controller means for supplying shift pulses to said shift register.

* * * * *